(12) United States Patent
Kusunose

(10) Patent No.: US 10,645,289 B2
(45) Date of Patent: May 5, 2020

(54) OPTICAL APPARATUS AND VIBRATION REMOVING METHOD

(71) Applicant: Lasertec Corporation, Yokohama (JP)

(72) Inventor: Haruhiko Kusunose, Yokohama (JP)

(73) Assignee: Lasertec Corporation, Yokohama (JP)

( * ) Notice: Subject to any disclaimer, the term of this patent is extended or adjusted under 35 U.S.C. 154(b) by 69 days.

(21) Appl. No.: 15/813,998

(22) Filed: Nov. 15, 2017

(65) Prior Publication Data

US 2018/0191958 A1 Jul. 5, 2018

(30) Foreign Application Priority Data

Jan. 5, 2017 (JP) ................................ 2017-000629

(51) Int. Cl.
  *G03F 7/20* (2006.01)
  *H04N 5/232* (2006.01)
  *G02B 27/64* (2006.01)

(52) U.S. Cl.
  CPC ....... *H04N 5/23264* (2013.01); *G02B 27/646* (2013.01); *G03F 7/70008* (2013.01); *G03F 7/709* (2013.01); *G03F 7/70033* (2013.01); *G03F 7/70141* (2013.01); *G03F 7/70191* (2013.01); *G03F 7/70833* (2013.01); *G03F 7/70841* (2013.01); *H04N 5/23296* (2013.01)

(58) Field of Classification Search
  None
  See application file for complete search history.

(56) References Cited

U.S. PATENT DOCUMENTS

| 4,803,712 A | 2/1989 | Kembo et al. |
| 5,930,324 A | 7/1999 | Matsui et al. |
| 2003/0035508 A1 | 2/2003 | Kasumi |
| 2003/0048428 A1* | 3/2003 | Kemper ................... F16J 3/047 355/53 |

(Continued)

FOREIGN PATENT DOCUMENTS

| JP | H04136943 A | 5/1992 |
| JP | H09275062 A | 10/1997 |

(Continued)

OTHER PUBLICATIONS

Japan Patent Office, Office Action Issued in Application No. 2017-000629, dated Jun. 20, 2017, 5 pages.

(Continued)

*Primary Examiner* — James Choi
(74) *Attorney, Agent, or Firm* — McCoy Russell LLP

(57) ABSTRACT

An optical apparatus and its vibration removing method capable of stabilizing a place where light is applied are provided. An optical apparatus according to an aspect of the present disclosure includes a light source chamber, an EUV light source, an optical system chamber, an optical system configured to guide light entering the optical system chamber to an object through a bellows, an optical sensor configured to detect EUV light L2 emitted from the EUV light source, a position sensor disposed to detect a relative position of the optical system chamber with respect to the light source chamber, and a second vibration removal unit configured to remove vibrations from the light source chamber based on detection results of the optical sensor and the position sensor.

10 Claims, 4 Drawing Sheets

(56) References Cited

U.S. PATENT DOCUMENTS

| | | |
|---|---|---|
| 2005/0168712 A1 | 8/2005 | Miyajima |
| 2006/0023180 A1* | 2/2006 | Hara .................. G03B 27/42 355/53 |
| 2007/0008509 A1* | 1/2007 | Shiraishi ............ G03F 7/70558 355/69 |
| 2008/0258070 A1 | 10/2008 | Scholz et al. |
| 2010/0140512 A1 | 6/2010 | Suganuma et al. |
| 2012/0019826 A1* | 1/2012 | Graham ............ G01B 11/0608 356/400 |
| 2012/0154774 A1* | 6/2012 | Van Der Wijst ........ G03F 7/708 355/53 |
| 2013/0022901 A1 | 1/2013 | Buurman et al. |
| 2018/0373158 A1* | 12/2018 | Baier .................. G03F 7/70033 |

FOREIGN PATENT DOCUMENTS

| | | |
|---|---|---|
| JP | H11185304 A | 7/1999 |
| JP | H11264444 A | 9/1999 |
| JP | H11327155 A | 11/1999 |
| JP | 2003059801 A | 2/2003 |
| JP | 2004311657 A | 11/2004 |
| JP | 2005136120 A | 5/2005 |
| JP | 2005223011 A | 8/2005 |
| JP | 2005273904 A | 10/2005 |
| JP | 2007048932 A | 2/2007 |
| JP | 2009071055 A | 4/2009 |
| JP | 2009525590 A | 7/2009 |
| JP | 2010123942 A | 6/2010 |
| JP | 2013026621 A | 2/2013 |
| WO | 2007054291 A1 | 5/2007 |

OTHER PUBLICATIONS

Japan Patent Office, Office Action Issued in Application No. 2017-000629, dated Aug. 15, 2017, 7 pages.

Japan Patent Office, Office Action Issued in Application No. 2017-000629, dated Nov. 7, 2017, 2 pages.

* cited by examiner

OPTICAL APPARATUS AND VIBRATION REMOVING METHOD

INCORPORATION BY REFERENCE

This application is based upon and claims the benefit of priority from Japanese Patent Application No. 2017-000629, filed on Jan. 5, 2017, the disclosure of which is incorporated herein in its entirety by reference for all purposes.

BACKGROUND

The present disclosure relates to an optical apparatus and its vibration removing method.

For a lithography technology that plays an important role in the miniaturization of semiconductor devices, ArF lithography in which an ArF excimer laser having an exposure wavelength of 193 nm is used as an exposure light source is currently used for mass-production. Further, an immersion technique (also called "ArF immersion lithography") for increasing the resolution of an exposure device by filling a space between its objective lens and a wafer with water has also begun to be used for mass production. In order to advance the miniaturization of semiconductor devices even further, development of various techniques for putting EUVL (Extremely Ultraviolet Lithography) having an exposure wavelength of 13.5 nm to practical use has been in progress.

In an apparatus using EUV light, an optical system is disposed inside a vacuum chamber so that an optical path is in a vacuum. When there is a vacuum pump and/or a driving mechanism such as a stage, vibrations occur. Further, in some cases, vibrations occur in a light source. Therefore, an exposure apparatus using a vibration removal table is disclosed.

An EUV exposure apparatus disclosed in Japanese Unexamined Patent Application Publication No. 2005-136120 includes two vibration removal tables. While one of the vibration removal tables removes vibrations from a stage apparatus and a loader, the other vibration removal table removes vibrations from an illumination optical system and a projection optical system. A vibration removal apparatus disclosed in Japanese Unexamined Patent Application Publication No. H11-264444 includes a vibration removal table using an air spring.

An exposure apparatus disclosed in Japanese Unexamined Patent Application Publication No. H11-327155 includes an exposure apparatus main unit, a laser oscillation unit, and a vibration removal table. All the units disposed in the exposure apparatus main unit are mounted on the vibration removal table. Further, the laser oscillation unit is connected to the exposure apparatus main unit through an accordion connection part. In this way, vibrations in the laser oscillation unit are prevented from propagating to the exposure apparatus main unit.

SUMMARY

The present inventors have found the following problem. In the above-described optical apparatuses, it is necessary to stabilize a place where light emitted from a light source is applied. Therefore, it is necessary to reliably remove vibrations that occur in a cooling mechanism, a driving mechanism, and the like. Further, when a DPP light source is used as the light source, there is a problem that the position of its light emitting point fluctuates.

The present disclosure has been made in view of the above-described circumstance and an object thereof is to provide an optical apparatus and its vibration removing method capable of stabilizing a place where light is applied.

A first exemplary aspect is an optical apparatus including: a light source vacuum chamber; a light source disposed inside the light source vacuum chamber; an optical system vacuum chamber; a bellows connecting the light source vacuum chamber with the optical system vacuum chamber, the bellows being configured so that light emitted from the light source passes therethrough; an optical system disposed inside the optical system vacuum chamber, the optical system being configured to guide light entering the optical system vacuum chamber to an object through the bellows; a first vibration removal unit configured to remove vibrations from the optical system vacuum chamber; an optical sensor disposed inside the optical system vacuum chamber, the optical sensor being configured to detect light emitted from the light source; a position sensor disposed to detect a relative position of the light source vacuum chamber with respect to the optical system vacuum chamber; and a second vibration removal unit configured to remove vibrations from the light source vacuum chamber based on detection results of the optical sensor and the position sensor. In this way, it is possible to stabilize a place where light is applied.

The above-described optical apparatus may further include a control unit configured to control the second vibration removal unit so that the relative position detected by the position sensor coincides with a predetermined target position, in which the control unit may correct the target position based on a position of the light detected by the optical sensor. In this way, it is possible to stabilize the place where light is applied.

In the above-described optical apparatus, the target position on a plane perpendicular to an optical axis of light from the light source may be corrected based on the position of the light detected by the optical sensor. In this way, it is possible to stabilize the place where light is applied.

In the above-described optical apparatus, the optical sensor may be disposed in a place conjugate with a light emitting point of the light source. In this way, it is possible to appropriately detect a deviation of the position of the light emitting point and thereby to stabilize the place where light is applied.

In the above-described optical apparatus, the bellows may be bent in an S-shape. It is possible to effectively prevent vibrations in the light source chamber from propagating to the optical system chamber.

The above-described optical apparatus may further include an air spring disposed between the light source vacuum chamber and the optical system vacuum chamber, the air spring being configured to work according to a pressure in the light source vacuum chamber and a pressure in the optical system vacuum chamber. In this way, it is possible to reduce a load on an actuator of the vibration removal unit.

In the above-described optical apparatus, the light source may be a DPP (Discharge Produced Plasma) light source configured to emit EUV (Extremely Ultraviolet) light.

Another exemplary aspect is a vibration removing method performed in an optical apparatus, the optical apparatus including: a light source vacuum chamber; a light source disposed inside the light source vacuum chamber; an optical system vacuum chamber; a bellows connecting the light source vacuum chamber with the optical system vacuum chamber, the bellows being configured so that light emitted from the light source passes therethrough; and an optical system disposed inside the optical system vacuum chamber, the optical system being configured to guide light entering the optical system vacuum chamber to an object through the bellows, the vibration removing method including: a step of detecting light emitted from the light source by an optical sensor disposed inside the light source vacuum chamber; a step of detecting a relative position of the optical system vacuum chamber with respect to the light source vacuum chamber by a position sensor, and a step of removing vibrations from the light source vacuum chamber based on detection results of the optical sensor and the position sensor. In this way, it is possible to stabilize a place where light is applied.

In the above-described vibration removing method, the relative position detected the position sensor may be controlled so as to coincide with a predetermined target position, and the target position may be corrected based on the position of the light detected by the optical sensor. In this way, it is possible to stabilize the place where light is applied.

In the above-described vibration removing method, the target position on a plane perpendicular to an optical axis of light from the light source may be corrected based on a position of the light detected by the optical sensor. In this way, it is possible to stabilize the place where light is applied.

In the above-described vibration removing method, the optical sensor may be disposed in a place conjugate with a light emitting point of the light source. In this way, it is possible to appropriately detect a deviation of the position of the light emitting point and thereby to stabilize the place where light is applied.

In the above-described vibration removing method, the bellows may be bent in an S-shape. It is possible to effectively prevent vibrations in the light source chamber from propagating to the optical system chamber.

In the above-described vibration removing method, the optical apparatus may further include an air spring disposed between the light source vacuum chamber and the optical system vacuum chamber, the air spring being configured to work according to a pressure in the light source vacuum chamber and a pressure in the optical system vacuum chamber. In this way, it is possible to reduce a load on an actuator of the vibration removal unit.

In the above-described vibration removing method, the light source may be a DPP light source configured to emit EUV light.

According to the present disclosure, it is possible to provide an optical apparatus and its vibration removing method capable of stabilizing a place where light is applied.

The above and other objects, features and advantages of the present disclosure will become more fully understood from the detailed description given hereinbelow and the accompanying drawings which are given by way of illustration only, and thus are not to be considered as limiting the present disclosure.

DESCRIPTION OF EMBODIMENTS

First Embodiment

Figure 1:
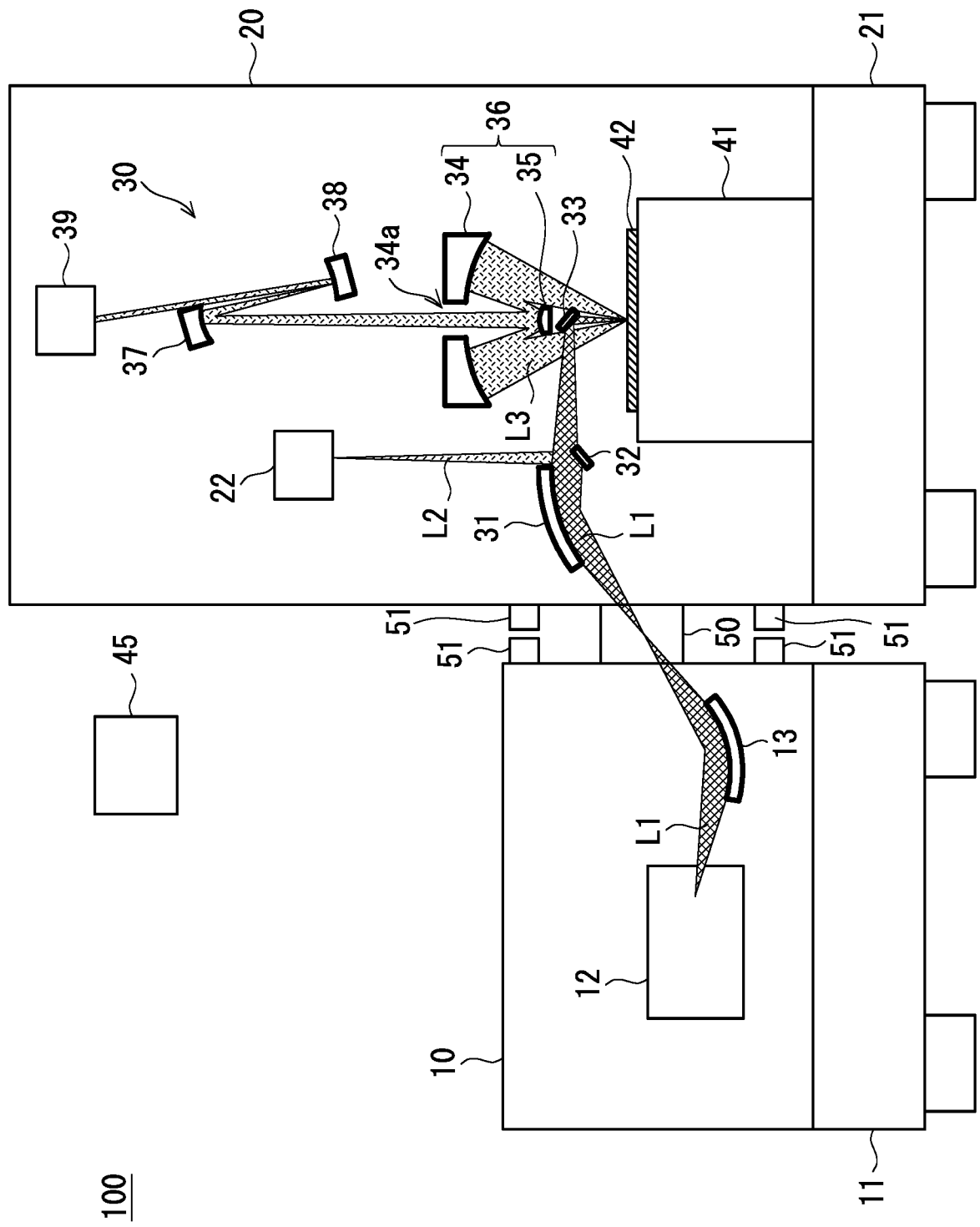
FIG. 1 shows a configuration of an inspection apparatus according to a first embodiment.

Embodiments according to the present disclosure are explained hereinafter with reference to the drawings. Firstly, an overall configuration of an optical apparatus according to this embodiment is explained with reference to FIG. 1. The optical apparatus according to this embodiment is an inspection apparatus 100 which inspects an EUV (Extremely Ultra Violet) mask by using EUV light. Therefore, a sample 42 is the EUV mask. Note that the EUV mask, which is the sample 42, may be a mask with a pattern formed thereon or may be a blank mask with no pattern formed thereon.

(Apparatus Configuration)

An inspection apparatus 100 according to this embodiment includes a light source chamber 10, a second vibration removal unit 11, an EUV light source 12, an ellipsoidal mirror 13, an optical system chamber 20, a first vibration removal unit 21, an optical system 30, a stage 41, a processing unit 45, a bellows 50, and a position sensor 51.

The light source chamber 10 is a vacuum chamber and is connected to a vacuum pump (not shown). The EUV light source 12 and the ellipsoidal mirror 13 are disposed inside the light source chamber 10. The light source chamber 10 is disposed on the second vibration removal unit 11. The second vibration removal unit 11 removes vibrations from the light source chamber 10. That is, the second vibration removal unit 11 removes vibrations that would otherwise be transmitted from a floor and the like to the light source chamber 10. The second vibration removal unit 11 is an active vibration removal table and includes an actuator that is driven according to an output from a sensor. For example, an air-pressure actuator can be used as the actuator for the second vibration removal unit 11. The control of the second vibration removal unit 11 will be described later.

The optical system chamber 20 is a vacuum chamber and is connected to a vacuum pump (not shown). The optical system chamber 20 is connected to the light source chamber 10 by using the bellows 50. That is, the internal space of the optical system chamber 20 is connected to the internal space of the light source chamber 10 through the bellows 50. Since the internal spaces of the light source chamber 10 and the optical system chamber 20 are in a vacuum state, the EUV light propagates in a vacuum. Note that the light source chamber 10 and the optical system chamber 20 may be evacuated by using a common vacuum pump or using different vacuum pumps.

The bellows 50 is accordion vacuum tubing. Further, the bellows 50 absorbs vibrations that would otherwise be transferred between the optical system chamber 20 and the light source chamber 10. Therefore, it is possible to prevent vibrations caused in a driving mechanism for the EUV light source 12 located inside the light source chamber 10 from being transmitted to the optical system chamber 20.

The stage 41 and the optical system 30 are disposed inside the optical system chamber 20. The optical system chamber 20 is disposed on the first vibration removal unit 21. The first vibration removal unit 21 removes vibrations from the optical system chamber 20. The first vibration removal unit 21 removes vibrations that would otherwise be transmitted from a floor and the like to the optical system chamber 20. The first vibration removal unit 21 is an active vibration removal table and includes an actuator that is driven according to an output from a sensor.

For example, air-pressure actuators can be used as the actuators for the second vibration removal unit 11 and the first vibration removal unit 21, Note that the actuator is not limited to the air-pressure actuator. That is, a piezo-actuator, a magnetostrictor, or the like may be used as the actuator.

The first vibration removal unit 21 detects an acceleration of the optical system chamber 20 and performs feed-back control and feed-forward control so as to cancel out the acceleration. That is, the first vibration removal unit 21 performs feed-control for the air pressure of the air-pressure actuator so that the acceleration of the optical system chamber 20 gets closer to zero. In this way, it is possible to suppress vibrations occurring in the optical system chamber 20.

The stage 41 is disposed in the optical system chamber 20. A sample 42 is placed on the stage 41. The stage 41 is a drive stage such as an XYZ-stage. The sample 42 is moved by moving the stage 41 on an XY-plane perpendicular to the optical axis. In this way, an illuminated place on the sample 42 is changed, thus making it possible to observe an arbitrary place on the sample 42.

The optical system 30 and the optical sensor 22 are disposed inside the optical system chamber 20. The optical system 30 includes an ellipsoidal mirror 31, a fetching mirror 32, a dropping mirror 33, a Schwarzschild magnification optical system 36, a concave mirror 37, a concave mirror 38, and a camera 39. The Schwarzschild magnification optical system 36 includes a concave mirror 34 with a hole formed therein and a convex mirror 35.

Firstly, an illumination optical system for guiding EUV light L1 emitted from the EUV light source to the sample 42 is explained. The EUV light source 12 generates EUV light L1 having a wavelength of 13.5 nm, which is the same wavelength as an exposure wavelength for the sample 42, which is an object to be inspected. The EUV light source 12 is, for example, a DPP (Discharge Produced Plasma) light source that uses an electric discharge. Further, the EUV light source 12 may be a DPP light source including a rotating electrode and/or a rotary foil trap. The EUV light source 12 is a point light source. The rotating electrode and the rotary foil trap include an actuator such as a motor and hence become a source of vibrations. As the rotating electrode and the rotary foil trap rotate, vibrations occur.

The EUV light L1 emitted from the EUV light source 12 travels while spreading (i.e., while its cross section is becoming larger). The EUV light L1 emitted from the EUV light source 12 is reflected on the ellipsoidal mirror 13. The EUV light L1 reflected on the ellipsoidal mirror 13 travels while becoming narrower (i.e., while its cross section is becoming smaller). Then, the EUV light L1 passes through the bellows 50. Note that the light concentration point of the EUV light L1, which is concentrated by the ellipsoidal mirror 13, is positioned inside the bellows 50. Therefore, the EUV light L1 coming from the bellows 50 travels while spreading. The EUV light L1 that has traveled through the bellows 50 and entered the optical system chamber 20 is reflected on the ellipsoidal mirror 31. The EUV light L1 reflected on the ellipsoidal mirror 31 travels while becoming narrower, and is incident on the dropping mirror 33.

The dropping mirror 33 is a plane mirror and disposed right above the sample 42. The EUV light L1 reflected on the dropping mirror 33 is incident on the sample 42. The ellipsoidal mirror 31 concentrates the EUV light L1 on the sample 42. In this way, an inspection area on the sample 42 is illuminated by the EUV light L1. Therefore, the EUV light L1 serves as illumination light illuminating the sample 42.

Further, the fetching mirror 32 is disposed on the optical path between the ellipsoidal mirror 31 and the dropping mirror 33. The fetching mirror 32 is disposed near a pupil position. The fetching mirror 32 reflects part of the EUV light L1 toward the optical sensor 22. Specifically, the fetching mirror 32 is disposed in a part of the optical path of the EUV light L1. Since the fetching mirror 32 is inserted into the middle of the optical path (i.e., halfway through the cross section of the optical path) of the EUV light L1, part of the EUV light L1 is incident on the fetching mirror 32. The EUV light reflected on the fetching mirror 32 is referred to as EUV light L2. The fetching mirror 32 cuts out a part of a pupil. In this way, the EUV light L1 is sampled by the fetching mirror 32.

The EUV light L2 reflected on the fetching mirror 32 is incident on the optical sensor 22. The optical sensor 22 is an area sensor in which pixels are arranged in a two-dimensional array pattern. Specifically, the optical sensor 22 is a CCD (Charge Coupled Device) sensor, a CMOS (Complementary Metal Oxide Semiconductor) sensor, or the like. The optical sensor 22 outputs its detection result to the processing unit 45.

The optical sensor 22 is disposed in a place conjugate with the light emitting point of the EUV light source 12. Therefore, when the position of the light emitting point of the EUV light source 12 is changed, the position on the optical sensor 22 on which the EUV light L2 is incident is also changed. The position on the optical sensor 22 on which the EUV light L2 is incident changes according to the change in the position of the light emitting point of the EUV light source 12. For example, when the position of the light emitting point changes on a plane perpendicular to the optical axis, the pixel in the optical sensor 22 on which the EUV light L2 is incident is changed. Therefore, it is possible to detect a change in the position of the light emitting point of the EUV light source 12 based on the detection result of the optical sensor 22. The optical sensor 22 detects a deviation of the position of the light emitting point from a reference position. Note that the position detected by the optical sensor 22 is a position on the plane perpendicular to the optical axis of the EUV light L1. The optical sensor 22 takes an image (i.e., takes a photograph) with a lower magnification than the magnification of the camera 39 (which will be described later).

Next, a detection optical system for detecting light coming from the sample 42 is explained. As described above, the EUV light L1 illuminates the inspection area of the sample 42. The EUV light reflected on the sample 42 is referred to as EUV light L3. The EUV light L3 reflected on the sample 42 enters the Schwarzschild magnification optical system 36. The Schwarzschild magnification optical system 36 includes the concave mirror 34 with a hole formed therein (hereinafter called the holed concave mirror 34) and the convex mirror 35 disposed above the sample 42.

The EUV light L3 reflected on the sample 42 is incident on the holed concave mirror 34. A hole 34a is formed at the center of the holed concave mirror 34. The EUV light L3 reflected on the holed concave mirror 34 is incident on the convex mirror 35. The convex mirror 35 reflects the EUV light L3 coming from the holed concave mirror 34 toward the hole 34a of the holed concave mirror 34. The EUV light L3 that passed through the hole 34a of the holed concave mirror 34 is reflected on the concave mirror 37 and the concave mirror 38, and enters the camera 39. By the Schwarzschild magnification optical system 36, the concave mirror 37, and the concave mirror 38, the inspection area on the sample 42 is projected onto the camera 39 in an enlarged size.

The EUV light L3 reflected on the concave mirror 38 is detected by the camera 39. The camera 39 is an image-pickup device such as a CCD (Charge Coupled Device) sensor, a CMOS (Complementary Metal Oxide Semiconductor) sensor, a TDI (Time Delay Integration) sensor, or the like, and takes an image of the sample 42. That is, the camera 39 takes an enlarged image of the inspection area on the sample 42.

The image of the sample 42 taken by the camera 39 is output to the processing unit 45. The processing unit 45 is an arithmetic processing unit including a processor, a memory, and so on, and inspects the sample 42 based on its image. For example, the processing unit 45 performs a defect inspection by comparing brightness of the image of the sample 42 with a threshold. Further, the processing unit 45 controls the coordinates of the stage 41. In this way, it is possible to specify coordinates of a defect on the sample 42.

The position sensor 51 is disposed in the light source chamber 10 and the optical system chamber 20. The position sensor 51 detects a relative position of the light source chamber 10 with respect to the optical system chamber 20. The position sensor 51 is, for example, a laser displacement meter. Specifically, the position sensor 51 is a 6-axis sensor and detects the relative position of the chamber.

Then, the position sensor 51 outputs the detected relative position to the processing unit 45 as a position detection signal. Further, a detection signal from the optical sensor 22 is input to the processing unit 45. The processing unit 45 controls the second vibration removal unit 11 based on the detection result of the position sensor 51 and the detection result of the optical sensor 22.

(Vibration Removal Control)

Figure 2:
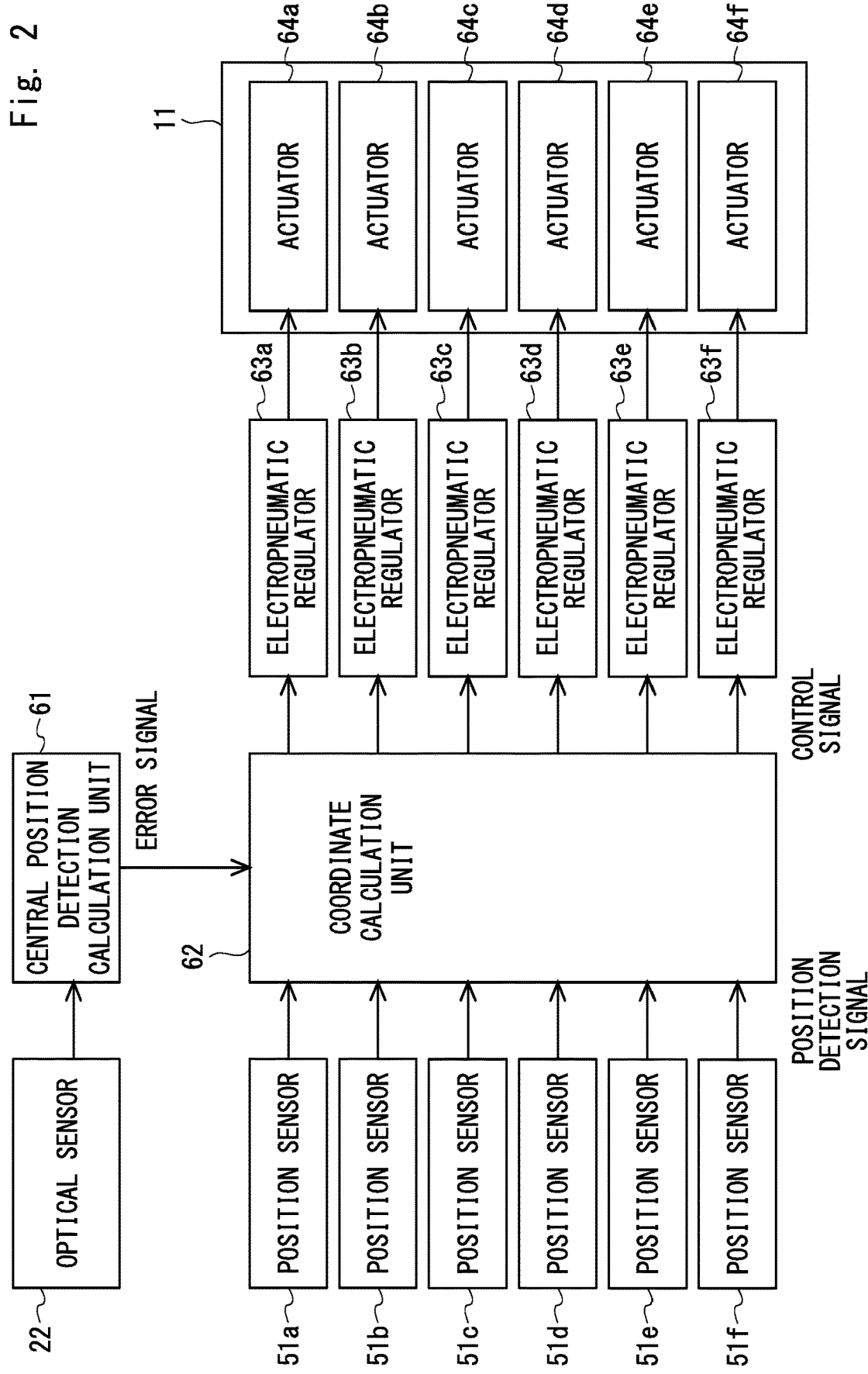
FIG. 2 is a block diagram showing a control system of the inspection apparatus.

Next, control of the second vibration removal unit 11 is explained with reference to FIG. 2. FIG. 2 is a block diagram showing a control configuration of the second vibration removal unit 11. Since the position sensor 51 is a 6-axis sensor, six axis sensors of the position sensor 51 are shown as first to sixth position sensors 51a to 51f, respectively, in FIG. 2.

The second vibration removal unit 11 includes first to sixth actuators 64a to 64f. The first to sixth actuators 64a to 64f are air-pressure actuators for actively removing vibrations.

A central position detection calculation unit 61 and a coordinate calculation unit 62 function as a part of the processing unit 45 shown in FIG. 1. The central position detection calculation unit 61 and the coordinate calculation unit 62 serve as a control unit that controls the second vibration removal unit 11. Specifically, the coordinate calculation unit 62 generates a control signal for controlling the second vibration removal unit 11. The central position detection calculation unit 61 and the coordinate calculation unit 62 may be formed by a microcomputer including a processor, a memory, and so on.

The first to sixth actuators 64a to 64f are controlled by air pressures supplied by first to sixth electropneumatic regulators 63a to 63f, respectively. For example, as the air pressures supplied by the first to sixth electropneumatic regulators 63a to 63f increase, the amounts of driving of the first to sixth actuators 64a to 64f increase. The air pressures supplied by the first to sixth electropneumatic regulators 63a to 63f are controlled according to control signals output from the coordinate calculation unit 62.

Needless to say, the first to sixth actuators 64a to 64f are driven independently of each other. That is, the coordinate calculation unit 62 generates respective control signals for controlling the first to sixth electropneumatic regulators 63a to 63f independently of each other.

In the following explanation, when the first to sixth actuators 64a to 64f do not need to be distinguished from each other, they are referred to as the actuator(s) 64. Similarly, when the first to sixth electropneumatic regulators 63a to 63f do not need to be distinguished from each other, they are referred to as the electropneumatic regulator(s) 63. In this embodiment, since the position sensor 51 is a 6-axis sensor, the number of the first to sixth actuators 64a to 64f is six. However, the number of position sensors 51 and the number of actuators 64 are each not limited to any particular number. The number of position sensors 51 and the number of actuators 64 can each be changed as appropriate and may be different from each other.

Each of the first to sixth position sensors 51a to 51f detects an acceleration or an angular speed on a respective one of the axes. Therefore, the first to sixth position sensors 51a to 51f constitute a 6-axis acceleration sensor. The position detection signals of the first to sixth position sensors 51a to 51f are output to the coordinate calculation unit 62.

The coordinate calculation unit 62 calculates a target position based on the position detection signals. For example, the coordinate calculation unit 62 calculates the target position so that the relative position detected by the position sensor 51 is fixed (i.e., unchanged). Then, the coordinate calculation unit 62 generates the control signal according to the target position. In this way, the second vibration removal unit 11 removes vibrations so that the relative position of the light source chamber 10 with respect to the optical system chamber 20 is fixed. In other words, the coordinate calculation unit 62 controls the first to sixth electropneumatic regulators 63a to 63f so that the positional relation between the optical system chamber 20 and the light source chamber 10 is fixed (i.e., unchanged).

For example, the axis directions in the coordinate system of the position sensor 51 differ from those in the coordinate system of the second vibration removal unit 11. Specifically, the coordinate system of the position sensor is defined by the detection axes of the 6-axis senor, i.e., the position sensor 51, and the coordinate system of the second vibration removal unit 11 is defined by the drive axes of the first to sixth actuators 64a to 64f. Since the directions of the detection axes differ from those of the drive axes, the coordinate calculation unit 62 performs a coordinate conversion. That is, the coordinate calculation unit 62 converts position coordinates in the coordinate system of the position sensor 51 into position coordinates in the coordinate system of the second vibration removal unit 11. Then, the coordinate calculation unit 62 generates the control signal so that the relative position of the light source chamber 10 coincides with a predetermined position.

As described above, the coordinate calculation unit 62 calculates the target position based on the position detection signals. Then, the coordinate calculation unit 62 generates the control signal based on the target position. The first to sixth actuators 64a to 64f of the second vibration removal unit 11 are driven so that the position of the light source chamber 10 coincides with the target position. As a result, the relative position of the light source chamber 10 with respect to the optical system chamber 20 is fixed. In this way, it is possible to apply the EUV light L1 to the stabilized irradiated place on the sample 42. Since it is possible to prevent the irradiated place from being displaced and thereby prevent the inspection area from being darkened, the inspection can be performed in a more stable manner.

Further, in this embodiment, the optical sensor 22 outputs a detection signal to the central position detection calculation unit 61. As described previously, the detection signal from the optical sensor 22 corresponds to the position of the light emitting point of the EUV light source 12. That is, the central position detection calculation unit 61 detects a deviation of the position of the light emitting point on the plane perpendicular to the optical axis of the EUV light L1. For example, the central position detection calculation unit 61 calculates coordinates of the center of gravity of the EUV light L2 on the detection surface (i.e., the two-dimensional array) of the optical sensor 22. Then, the central position detection calculation unit 61 measures an amount of a deviation of the position of the light emitting point based on the change in the position of the center of gravity of the EUV light L2 on the detection surface. The central position detection calculation unit 61 outputs an error signal indicating the amount of the deviation of the position of the light emitting point to the coordinate calculation unit 62.

Further, the coordinate calculation unit 62 corrects the target position based the amount of the deviation of the position included in the error signal. Specifically, the coordinate calculation unit 62 converts the deviation amount on the plane perpendicular to the optical axis into position coordinates in the coordinate system of the second vibration removal unit 11. Then, the coordinate calculation unit 62 corrects the target position so that the deviation amount of the position detected by the optical sensor 22 is cancelled out. Specifically, the coordinate calculation unit 62 adds a correction amount corresponding to the deviation amount of the position to the target position included in the control signal. Then, the coordinate calculation unit 62 performs feedback control for the actuator 64 so that the light source chamber 10 is positioned in the corrected target position.

By doing so, it is possible to stabilize the place where the EUV light L1 is applied on the sample 42. That is, the coordinate calculation unit 62 corrects the deviation of the position of the light emitting point so that the position of the light emitting point has a conjugate positional relation with the position of the observation point on the sample in the camera 39. Even when the position of the light emitting point in the EUV light source 12 fluctuates, the place where the EUV light L1 is applied on the sample 42 is fixed. By the above-described vibration removing method, the inspection can be performed in a more stable manner.

The error signal output from the central position detection calculation unit 61 may provide a correction value on the plane perpendicular to the optical axis of the EUV light L1 to the target position, but may provide no correction value for the axis directions other than the optical axis direction. That is, the control for the rotational component and the tilting component may be performed based solely on the position detection signal output from the position sensor 51.

As described above, the coordinate calculation unit 62 controls the second vibration removal unit 11 based on the detection result of the optical sensor 22 and the detection result of the position sensor 51. That is, the coordinate calculation unit 62 performs feedback control for the actuator 64 so that the change in the relative position of the light source chamber 10 and the deviation amount of the position of the light emitting point are cancelled out, instead of performing control so that the acceleration of the first vibration removal unit 21 is cancelled out. By doing so, it is possible to remove not only the mechanical vibrations but also the change in the position of the light emitting point. Therefore, it is possible to effectively remove vibrations and thereby to stabilize the irradiated place. As a result, it is possible to perform a stable inspection.

Note that the cycle in which the error signal is updated can be made longer than the cycle in which the position detection signal is updated. For example, the position of the light emitting point often drifts due to thermal expansion or the like and hence does not change abruptly. Therefore, the cycle in which the error signal is updated may be set to about one to ten minutes.

Further, since the area sensor is used as the optical sensor 22 in this embodiment, the optical axis can be easily adjusted. For example, it is easy to detect a deviation of the optical axis of the EUV light L1 before and after replacement of the EUV light source 12 such as at the time of maintenance. That is, alignment is performed by measuring the place on which the EUV light L2 is incident in the optical sensor 22 before and after replacement of the EUV light source 12 so that the incident place after the replacement coincides with the incident place before the replacement. In this way, the EUV light source 12 can be easily replaced. In particular, the magnification of the optical sensor 22 is lower than that of the camera 39 and the field of view of the optical sensor 22 is wider than that of the camera 39. Therefore, even when the incident place of the EUV light L2 is considerably deviated, the optical axis can be easily adjusted.

Further, when the optical axis is adjusted, the position in the optical axis direction in addition to the position on the plane perpendicular to the optical axis may be adjusted. Since the position sensor 51 is a 6-axis sensor, it can detect a change in the position in the optical axis direction. The actuator 64 is driven in the direction along the optical axis according to the detection result of the position sensor 51. In this way, it is possible to change the distance between the ellipsoidal mirror 13 and the ellipsoidal mirror 31 and thereby to adjust the focal point. By doing so, the focus can be easily adjusted in a three-dimensional manner. In this way, it is possible to prevent the focal point from being deviated and thereby to adjust the focal point on the sample 42. Further, the adjustment of the optical axis may be periodically performed during the use of the EUV light source 12 as well as when the EUV light source 12 is replaced.

(Connecting Place of Chamber)

Figure 3:
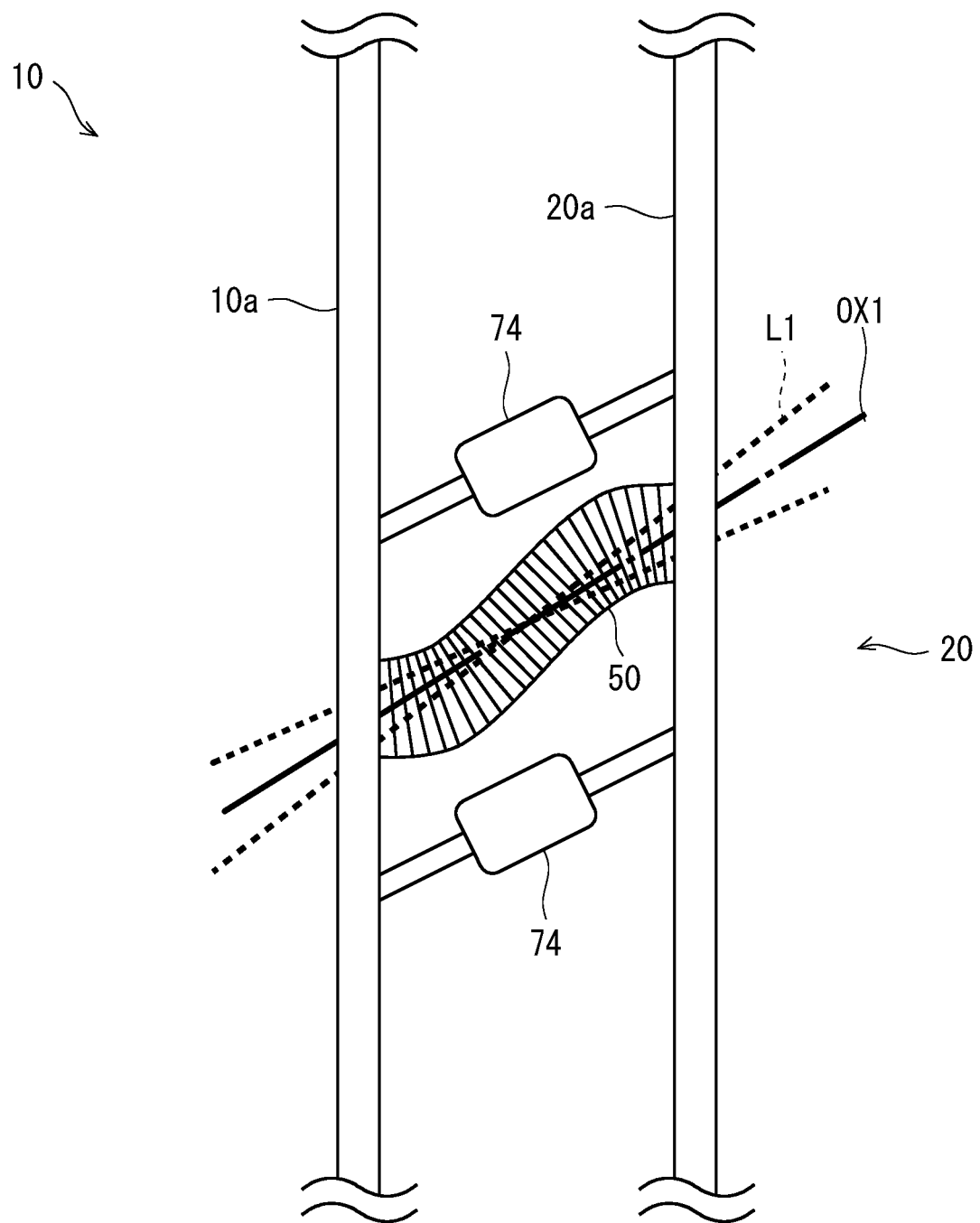
FIG. 3 shows a configuration of a connecting part of a chamber.

Next, an example of the connecting place between two vacuum chambers is explained with reference to FIG. 3. FIG. 3 shows a connecting place between the light source chamber 10 and the optical system chamber 20 shown in FIG. 1. A wall of the light source chamber 10 facing the optical system chamber 20 is shown as a chamber wall 10a. A wall of the optical system chamber 20 facing the light source chamber 10 is shown as a chamber wall 20a. The chamber wall 10a is opposed to the chamber wall 20a and they are parallel to each other.

The light source chamber 10 is connected to the optical system chamber 20 through the bellows 50. Specifically, one end of the bellows 50 is fixed to the chamber wall 10a and the other end thereof is fixed to the chamber wall 20a. The bellows 50, which is disposed between the chamber walls 10a and 20a, is bent in an S-shape. Therefore, the optical axis OX1 of the EUV light L1 is inclined from the direction perpendicular to the chamber wall 10a. Similarly, the optical axis OX1 of the EUV light L1 is inclined from the direction perpendicular to the chamber wall 20a.

If the bellows 50 is disposed in a straight line, its stiffness in the rotational direction increases. That is, vibrations in the rotational direction around the central axis of the bellows 50 are not absorbed by the bellows 50 and propagate between the chambers. In contrast to this, by connecting the chambers while twisting (i.e., bending) the bellows 50 in the S-shape as shown in this embodiment, it is possible to decrease the stiffness of the bellows 50 in the rotational direction. In this way, it is possible to make the bellows 50 absorb vibrations in the rotational direction.

Further, air springs 74 are provided between the chamber walls 10*a* and 20*a*. In this example, two air springs 74 are provided between the chamber walls 10*a* and 20*a*. The air springs 74 are disposed on both sides of the bellows 50. That is, the bellows 50 is disposed between the two air springs 74.

The air springs 74 work according to the pressure in the light source chamber 10 and the optical system chamber 20. For example, when the light source chamber 10 and the optical system chamber 20 are brought into a vacuum state, the air springs 74 work so that the attractive force between the chambers is cancelled out. By doing so, it is possible to reduce the load on the actuators of the second vibration removal unit 11 and the first vibration removal unit 21.

Note that only one air spring 74 may be disposed between the chamber walls 10*a* and 20*a*, or three or more air springs 74 may be disposed therebetween. The number of air springs 74 is optionally at least two. By arranging a plurality of air springs 74 around the bellows 50 in a rotationally symmetric manner, it is possible to reduce the load on the actuators of the second vibration removal unit 11 and the first vibration removal unit 21 without causing any momentum force between the chamber walls 10*a* and 20*a*.

Figure 4:
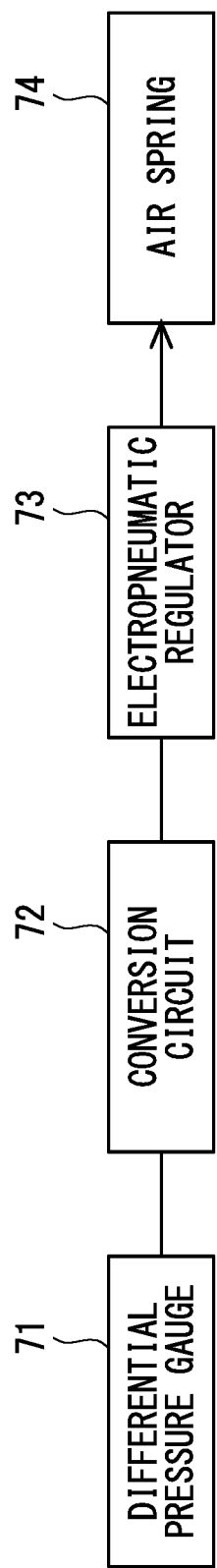
FIG. 4 is a block diagram showing a control configuration of the connecting part of the chamber.

Next, a control system for controlling the air springs 74 is explained with reference to FIG. 4. FIG. 4 is a block diagram showing a control configuration for controlling the air springs 74. A differential pressure gauge 71 measures the pressure of the light source chamber 10 and the optical system chamber 20. Specifically, the differential pressure gauge 71 measures a difference of the pressure of the light source chamber 10 (i.e., a difference from the atmospheric pressure) and a difference of the pressure of the optical system chamber 20 (i.e., a difference from the atmospheric pressure). Then, the differential pressure gauge 71 outputs the measured pressures to a conversion circuit 72.

The conversion circuit 72 converts the two measured pressures into a force that is exerted between the light source chamber 10 and the optical system chamber 20. When the light source chamber 10 and the optical system chamber 20 are brought into a vacuum state, an attractive force is exerted between the light source chamber 10 and the optical system chamber 20 according to the pressure difference. That is, when the pressure is changed from the atmospheric pressure to a vacuum, a force occurs in a contracting direction of the bellows 50 and hence the distance between the chambers decreases. The conversion circuit 72 calculates the attractive force based on the pressure difference. Note that the force that occurs between the light source chamber 10 and the optical system chamber 20 can be determined based on the shape, the area, the pressure difference, and the like of each chamber.

The conversion circuit 72 controls a pressure of an electropneumatic regulator 73 so that the force exerted between chambers is cancelled out. The electropneumatic regulator 73 generates a pressure for driving the air springs 74. Therefore, the air springs 74 are driven so that the force exerted between the chambers is cancelled out.

By the above-described configuration, the attractive force between the light source chamber 10 and the optical system chamber 20 is cancelled out. As a result, the actuators of the second vibration removal unit 11 and the first vibration removal unit 21 do not need to cancel out the attractive force caused by the pressure difference all the time. It is possible to maintain the working state of the actuators of the second vibration removal unit 11 and the first vibration removal unit 21 unchanged irrespective of whether the light source chamber 10 and the optical system chamber 20 are in the atmospheric pressure or in the vacuum. In other words, since the attractive force between the chambers is cancelled out by the air springs 74, no extra thrusting force, which would otherwise be required to cancel out the attractive force, is necessary in the second vibration removal unit 11 and the first vibration removal unit 21. The sizes of the second vibration removal unit 11 and the first vibration removal unit 21 can be reduced.

Note that the structure for connecting the chambers shown in FIG. 3 may be applied to other optical apparatuses as well as the inspection apparatus 100 according to the first embodiment. For example, the configuration shown in FIG. 3 can be applied to an inspection apparatus having a configuration different from that shown in FIG. 1, an observation apparatus, an exposure apparatus, or the like.

An optical apparatus according to this embodiment includes a first vacuum chamber, a second vacuum chamber, and a bellows connecting the first vacuum chamber with the second vacuum chamber, in which the bellows is bent in an S-shape. In this way, the bellows can suppress transmission of vibrations in all the directions including the rotational direction without blocking the beam of light.

Further, the optical apparatus includes a first vibration removal unit configured to remove vibrations from the first vacuum chamber and a second vibration removal unit configured to remove vibrations from the second vacuum chamber, in which an air spring is disposed between the first and second vacuum chambers and the air spring works according to a pressure of the first and second vacuum chambers. In this way, it is possible to reduce the load on the actuator of the vibration removal unit even when the vacuum chamber is evacuated.

Although the configuration of the inspection apparatus 100 is explained in the above explanation, the present disclosure can be applied to optical apparatuses other than the inspection apparatus. For example, the irradiated place can be stabilized in other optical apparatuses such as a measurement apparatus, an observation apparatus, and an exposure apparatus. The optical apparatus according to this embodiment is suitable for an optical apparatus using EUV light or VUV light which is considerably absorbed in the air.

Although embodiments according to the present disclosure have been explained above, the present disclosure also includes various modifications that do not substantially impair the purposes and the advantages of the present disclosure. Further, the above-described embodiments should not be used to limit the scope of the present disclosure.

A program can be stored and provided to a computer using any type of non-transitory computer readable media. Non-transitory computer readable media include any type of tangible storage media. Examples of non-transitory computer readable media include magnetic storage media (such as floppy disks, magnetic tapes, hard disk drives, etc.), optical magnetic storage media (e.g. magneto-optical disks), CD-ROM (compact disc read only memory), CD-R (compact disc recordable), CD-R/W (compact disc rewritable), and semiconductor memories (such as mask ROM, PROM (programmable ROM), EPROM (erasable PROM), flash ROM, RAM (random access memory), etc.). The program may be provided to a computer using any type of transitory computer readable media. Examples of transitory computer readable media include electric signals, optical signals, and electromagnetic waves. Transitory computer readable media can provide the program to a computer via a wired communication line (e.g. electric wires, and optical fibers) or a wireless communication line.

From the present disclosure thus described, it will be obvious that the embodiments of the present disclosure may be varied in many ways. Such variations are not to be regarded as a departure from the spirit and scope of the present disclosure, and all such modifications as would be obvious to one skilled in the art are intended for inclusion within the scope of the following claims.

What is claimed is:

1. An optical apparatus comprising:
a light source vacuum chamber;
a light source disposed inside the light source vacuum chamber;
an optical system vacuum chamber;
a bellows connecting the light source vacuum chamber with the optical system vacuum chamber, the bellows being configured so that light emitted from the light source passes therethrough;
an optical system including at least one mirror disposed inside the optical system vacuum chamber, the optical system being configured to guide light entering the optical system vacuum chamber through the bellows, to an object in the optical system vacuum chamber;
a first actuator included in a first vibration removal unit, the first vibration removal unit being configured to remove vibrations from the optical system vacuum chamber so that an acceleration of the optical system vacuum chamber is cancelled out;
an optical sensor disposed inside the optical system vacuum chamber, the optical sensor being configured to detect a position of light on a plane perpendicular to an optical axis of the light emitted from the light source;
a position sensor disposed to detect a position of the light source vacuum chamber relative to the optical system vacuum chamber;
a second actuator included in a second vibration removal unit, the second vibration removal unit being configured to remove vibrations from the light source vacuum chamber based on detection results of the optical sensor and the position sensor; and
a control unit configured to control the second vibration removal unit to adjust the position of the light source vacuum chamber relative to the optical system vacuum chamber so that the position detected by the position sensor coincides with a predetermined target position based on a deviation of a position of a light point emitted from the light source disposed inside the light source vacuum chamber, the position of the light point detected by the optical sensor,
wherein the control unit corrects the target position on the plane perpendicular to the optical axis of the light based on the position of the light detected by the optical sensor.

2. The optical apparatus according to claim 1, wherein the optical sensor is disposed in a place conjugate with a light emitting point of the light source.

3. The optical apparatus according to claim 1, wherein the bellows is bent in an S-shape.

4. The optical apparatus according to claim 1, further comprising an air spring disposed between the light source vacuum chamber and the optical system vacuum chamber, the air spring being configured to work according to a pressure in the light source vacuum chamber and the optical system vacuum chamber.

5. The optical apparatus according to claim 1, wherein the light source is a DPP (Discharge Produced Plasma) light source configured to emit EUV (Extremely Ultraviolet) light.

6. A vibration removing method performed in an optical apparatus,
the optical apparatus comprising:
a light source vacuum chamber;
a light source disposed inside the light source vacuum chamber;
an optical system vacuum chamber;
a bellows connecting the light source vacuum chamber with the optical system vacuum chamber, the bellows being configured so that light emitted from the light source passes therethrough; and
an optical system including at least one mirror disposed inside the optical system vacuum chamber, the optical system being configured to guide light entering the optical system vacuum chamber through the bellows, to an object in the optical system vacuum chamber, and
the vibration removing method comprising:
a step of cancelling out an acceleration of the optical system vacuum chamber;
a step of detecting a position of light on a plane perpendicular to an optical axis of the light emitted from the light source by an optical sensor disposed inside the optical system vacuum chamber;
a step of detecting a relative position of the light source vacuum chamber with respect to the optical system vacuum chamber by a position sensor, and
a step of removing vibrations from the light source vacuum chamber based on detection results of the optical sensor and the position sensor,
wherein the relative position of the light source vacuum chamber detected by the position sensor is controlled so as to coincide with a predetermined target position, and
wherein the target position on the plane perpendicular to the optical axis of the light is corrected based on a deviation of a position of a light point emitted by the light source disposed inside the light source vacuum chamber, the position of the light point detected by the optical sensor.

7. The vibration removing method according to claim 6, wherein the optical sensor is disposed in a place conjugate with a light emitting point of the light source.

8. The vibration removing method according to claim 6, wherein the bellows is bent in an S-shape.

9. The vibration removing method according to claim 6, wherein the optical apparatus further comprises an air spring disposed between the light source vacuum chamber and the optical system vacuum chamber, the air spring being configured to work according to a pressure in the light source vacuum chamber the optical system vacuum chamber.

10. The vibration removing method according to claim 6, wherein the light source is a DPP (Discharge Produced Plasma) light source configured to emit EUV (Extremely Ultraviolet) light.

* * * * *